United States Patent
Sharma et al.

(10) Patent No.: US 7,790,631 B2
(45) Date of Patent: Sep. 7, 2010

(54) SELECTIVE DEPOSITION OF A DIELECTRIC ON A SELF-ASSEMBLED MONOLAYER-ADSORBED METAL

(75) Inventors: Ajay K. Sharma, Beaverton, OR (US); Sean King, Beaverton, OR (US); Dennis Hanken, Beaverton, OR (US); Andrew W. Ott, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 734 days.

(21) Appl. No.: 11/603,522

(22) Filed: Nov. 21, 2006

(65) Prior Publication Data
US 2008/0116481 A1 May 22, 2008

(51) Int. Cl.
*H01L 21/31* (2006.01)
(52) U.S. Cl. ............. 438/780; 438/778; 257/377; 257/E21.17; 427/264; 430/324
(58) Field of Classification Search ................. 257/377, 257/E21.17, E21.171; 427/264; 430/324; 438/736, 497, 672, 623, 689, 778, 780
See application file for complete search history.

(56) References Cited

U.S. PATENT DOCUMENTS

| | | | | |
|---|---|---|---|---|
| 4,686,000 | A * | 8/1987 | Heath ..................... | 438/702 |
| 5,512,131 | A * | 4/1996 | Kumar et al. ............. | 438/738 |
| 6,020,024 | A | 2/2000 | Maiti et al. | |
| 6,114,099 | A * | 9/2000 | Liu et al. ................. | 430/324 |
| 6,121,663 | A * | 9/2000 | En et al. .................. | 257/377 |
| 6,297,169 | B1 * | 10/2001 | Mangat et al. ............ | 438/736 |
| 6,413,587 | B1 * | 7/2002 | Hawker et al. ........... | 427/264 |
| 6,518,168 | B1 * | 2/2003 | Clem et al. .............. | 438/623 |
| 6,559,474 | B1 * | 5/2003 | Craighead et al. ........ | 257/40 |
| 6,638,874 | B2 | 10/2003 | Yi et al. | |
| 6,677,238 | B2 * | 1/2004 | Seki ....................... | 438/681 |
| 6,893,966 | B2 * | 5/2005 | Delamarche et al. ...... | 438/689 |
| 7,067,306 | B2 * | 6/2006 | Singhvi et al. ........... | 435/283.1 |
| 7,199,051 | B2 * | 4/2007 | Lee et al. ................. | 438/672 |
| 7,244,669 | B2 * | 7/2007 | Sirringhaus et al. ....... | 438/535 |
| 7,329,592 | B2 * | 2/2008 | Myerson et al. .......... | 438/497 |

(Continued)

OTHER PUBLICATIONS

Eun K, Seo, et al., "Atomic Layer Depositioin of Titanium Oxide on Self-Assembled-Mololayer-Coated Gold", Department of Chemistry, Kookmin University, Chongnung-dong, Sokgbuk-ku, Seoul 136-702, Korea, pp. 1878-1883.

(Continued)

*Primary Examiner*—Lex Malsawma
*Assistant Examiner*—William F Kraig
(74) *Attorney, Agent, or Firm*—Blakely, Sokoloff, Taylor & Zafman LLP

(57) ABSTRACT

Methods and apparatuses to selectively deposit a dielectric on a self-assembled monolayer ("SAM") adsorbed metal are described. A wafer includes a device having a first electrode. A first self-assembled monolayer is deposited on the wafer covering the first electrode. Next, a portion of the first self-assembled monolayer is removed to expose the first electrode. The first self-assembled monolayer includes a hydrophobic layer. Further, second self-assembled monolayer is deposited on the first electrode. The second self-assembled monolayer includes a hydrophilic layer. Next, an insulating layer is deposited on the second self-assembled monolayer. Further, self-aligned contacts to one or more second electrodes of the device are formed.

8 Claims, 15 Drawing Sheets

U.S. PATENT DOCUMENTS

| | | | |
|---|---|---|---|
| 7,390,739 B2 * | 6/2008 | Lazovsky et al. | 438/653 |
| 2002/0140103 A1 | 10/2002 | Kloster et al. | |
| 2003/0064580 A1 | 4/2003 | Ott et al. | |
| 2003/0082858 A1 * | 5/2003 | Morii et al. | 438/151 |
| 2003/0137050 A1 | 7/2003 | Chambers et al. | |
| 2003/0143823 A1 | 7/2003 | Ott et al. | |
| 2003/0173651 A1 | 9/2003 | Wong et al. | |
| 2003/0186535 A1 | 10/2003 | Wong et al. | |
| 2003/0230170 A1 | 12/2003 | Woodfield et al. | |
| 2003/0231974 A1 | 12/2003 | Woodfield et al. | |
| 2004/0016319 A1 | 1/2004 | Woodfield et al. | |
| 2004/0072093 A1 * | 4/2004 | Itami | 430/125 |
| 2004/0101667 A1 | 5/2004 | O'Loughlin et al. | |
| 2004/0118245 A1 | 6/2004 | Ott et al. | |
| 2004/0118246 A1 | 6/2004 | Woodfield et al. | |
| 2004/0118247 A1 | 6/2004 | Woodfield et al. | |
| 2004/0119163 A1 | 6/2004 | Wong et al. | |
| 2004/0120841 A1 | 6/2004 | Ott et al. | |
| 2004/0132314 A1 * | 7/2004 | Decre et al. | 438/761 |
| 2004/0141869 A1 | 7/2004 | Ott et al. | |
| 2004/0146640 A1 | 7/2004 | Ott et al. | |
| 2004/0159185 A1 | 8/2004 | Shamblen et al. | |
| 2004/0165815 A1 * | 8/2004 | Kitagawa | 385/16 |
| 2004/0170760 A1 | 9/2004 | Meagley et al. | |
| 2004/0185679 A1 | 9/2004 | Ott et al. | |
| 2004/0208773 A1 | 10/2004 | Woodfield et al. | |
| 2004/0211293 A1 | 10/2004 | Shamblen et al. | |
| 2004/0253136 A1 | 12/2004 | Shamblen et al. | |
| 2004/0263739 A1 * | 12/2004 | Sirringhaus et al. | 349/135 |
| 2005/0050997 A1 | 3/2005 | Shamblen et al. | |
| 2005/0087517 A1 | 4/2005 | Ott et al. | |
| 2005/0145070 A1 | 7/2005 | Woodfield et al. | |
| 2005/0189599 A1 | 9/2005 | Lu | |
| 2005/0208753 A1 | 9/2005 | Ott et al. | |
| 2005/0217426 A1 | 10/2005 | Shamblen et al. | |
| 2005/0220656 A1 | 10/2005 | Shamblen et al. | |
| 2005/0223849 A1 | 10/2005 | Ott et al. | |
| 2006/0003597 A1 | 1/2006 | Golonzka et al. | |
| 2006/0018781 A1 | 1/2006 | Woodfield et al. | |
| 2006/0038296 A1 | 2/2006 | King et al. | |
| 2006/0057017 A1 | 3/2006 | Woodfield et al. | |
| 2006/0102255 A1 | 5/2006 | Woodfield et al. | |
| 2006/0102955 A1 | 5/2006 | Chen et al. | |
| 2006/0128142 A1 * | 6/2006 | Whelan et al. | 438/638 |
| 2006/0167725 A1 | 7/2006 | Grunspan et al. | |
| 2006/0275167 A1 | 12/2006 | Ott et al. | |
| 2007/0032675 A1 | 2/2007 | Meagley et al. | |
| 2007/0044870 A1 | 3/2007 | Woodfield et al. | |
| 2007/0059888 A1 | 3/2007 | Sukekawa | |
| 2007/0105136 A1 | 5/2007 | Staudt et al. | |
| 2007/0152343 A1 | 7/2007 | Richter et al. | |
| 2007/0257249 A1 | 11/2007 | Mocuta et al. | |
| 2008/0001237 A1 | 1/2008 | Chang et al. | |
| 2008/0116481 A1 | 5/2008 | Sharma et al. | |

OTHER PUBLICATIONS

Gladfelter, Wayne L., "Selective Metallization by Chemical Vapor Disposition," American Chemical Society, 0897-4756/93/2805-1372 (1993) pp. 1372-1388.

Lane, M. W., et al., "Relationship between Interfacial Adhesion and Electromigration in Cu Metallization," Journal of Applied Physics, vol. 93, No. 3, Feb. 1, 2003, pp. 1417-1420.

* cited by examiner

SELECTIVE DEPOSITION OF A DIELECTRIC ON A SELF-ASSEMBLED MONOLAYER-ADSORBED METAL

FIELD

Embodiments of the invention relate to the field of microelectronic device manufacturing; and more specifically, to fabrication of self-aligned contacts.

BACKGROUND

The sizes of the microelectronic devices, e.g., transistors, and other active and passive electrical components, continuously scale down in attempts to increase device integration density in integrated circuits that are spaced more closely together. Electrical contacts are fabricated to provide an electrical access to the microelectronic devices built on a wafer. Typically, lithography techniques are used to define the location of contact holes to the devices. As the size of the microelectronic devices and spacing between them decrease, the risk of contact shortings increases. The shorting of the contact may occur, for example, due to misalignments of the contacts, imperfections of the wafer processing operations, and resolution limitations of the patterning and lithography tools. Contact shortings limit the critical dimensions of the devices and the wafer yield.

A typical technique to form self-aligned contacts to source/drain regions of a transistor built on the wafer involves depositing an insulating layer, for example, silicon nitride layer on the transistor. Then the insulating layer is patterned and etched through using conventional photolithographic tools to create contact holes. The contact holes are then filled with a conductive material to form electrical contacts to source/drain regions of the transistor. Due to alignment/registration and other processing imperfections, the contact hole may be created above a gate electrode so that the conductive material may land directly on the gate electrode. Placing the self-aligned contact directly on the gate electrode causes contact-to-gate shorting. The contact-to-gate shorting renders the transistor to be non-operable and results in low wafer yield.

One way to reduce the risk of contact shortings involves developing of lithography alignment techniques that have reduced tolerances. Techniques to reduce lithographic alignment tolerances, however, have typically not scaled at the same rate as techniques to scale the size of microelectronic devices.

Another way to reduce the risk of contact shorting involves reducing of the contact hole size to the devices on the wafer. Reducing the contact hole size, however, may not represent an acceptable approach when forming highly integrated devices because reductions in contact hole size typically lead to substantial and unacceptable increases in contact resistance.

Currently, to reduce the risk of misalignment of the contacts, multiple alignment adjusting operations are performed. Typically, the wafer is subjected to repeating lithography, patterning, etching, and other processing operations until a desired alignment of the contact relative to the contact area of the device is achieved. This approach requires multiple modifications of the wafer that increases the risk of contaminating of the wafer and is time and labor consuming resulting in high manufacturing costs.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

In the following description, numerous specific details, for example, specific materials, structures, dimensions of the elements, processes, etc. are set forth in order to provide thorough understanding of one or more of the embodiments of the present invention. It will be apparent, however, to one of ordinary skill in the art that the one or more embodiments of the present invention may be practiced without these specific details. In other instances, microelectronic device fabrication processes, techniques, materials, equipment, etc., have not been described in great details to avoid unnecessarily obscuring of this description. Those of ordinary skill in the art, with the included description, will be able to implement appropriate functionality without undue experimentation.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Methods and apparatuses to selectively deposit a dielectric on a self-assembled monolayer ("SAM") adsorbed metal are described herein. A wafer includes a microelectronic device having a first electrode and one or more other electrodes. In one embodiment, the microelectronic device is a transistor and the first electrode is a gate electrode. A first self-assembled monolayer is deposited on the wafer covering the electrode. Next, a portion of the first self-assembled monolayer is removed to expose the first electrode. The first self-assembled monolayer includes a hydrophobic layer. Next, a second self-assembled monolayer is deposited on the first electrode. The second self-assembled monolayer includes a hydrophilic layer. Next, an insulating layer is deposited on the second self-assembled monolayer. Further, self-aligned contacts to one or more other electrodes of the device can be formed. The selectively deposited insulating layer protects the first electrode of the device from shorting if a misaligned self-aligned contact is formed over the first electrode. Thus, the selective area deposition ("SAD") of the insulating layer on the first electrode eliminates the need for multiple alignment adjusting operations and increases the allowable registration/alignment budget. The SAD of the insulating layer on the gate electrode provides safe and efficient formation of self-aligned contacts for the advanced wafer front end technology.

Figure 1:
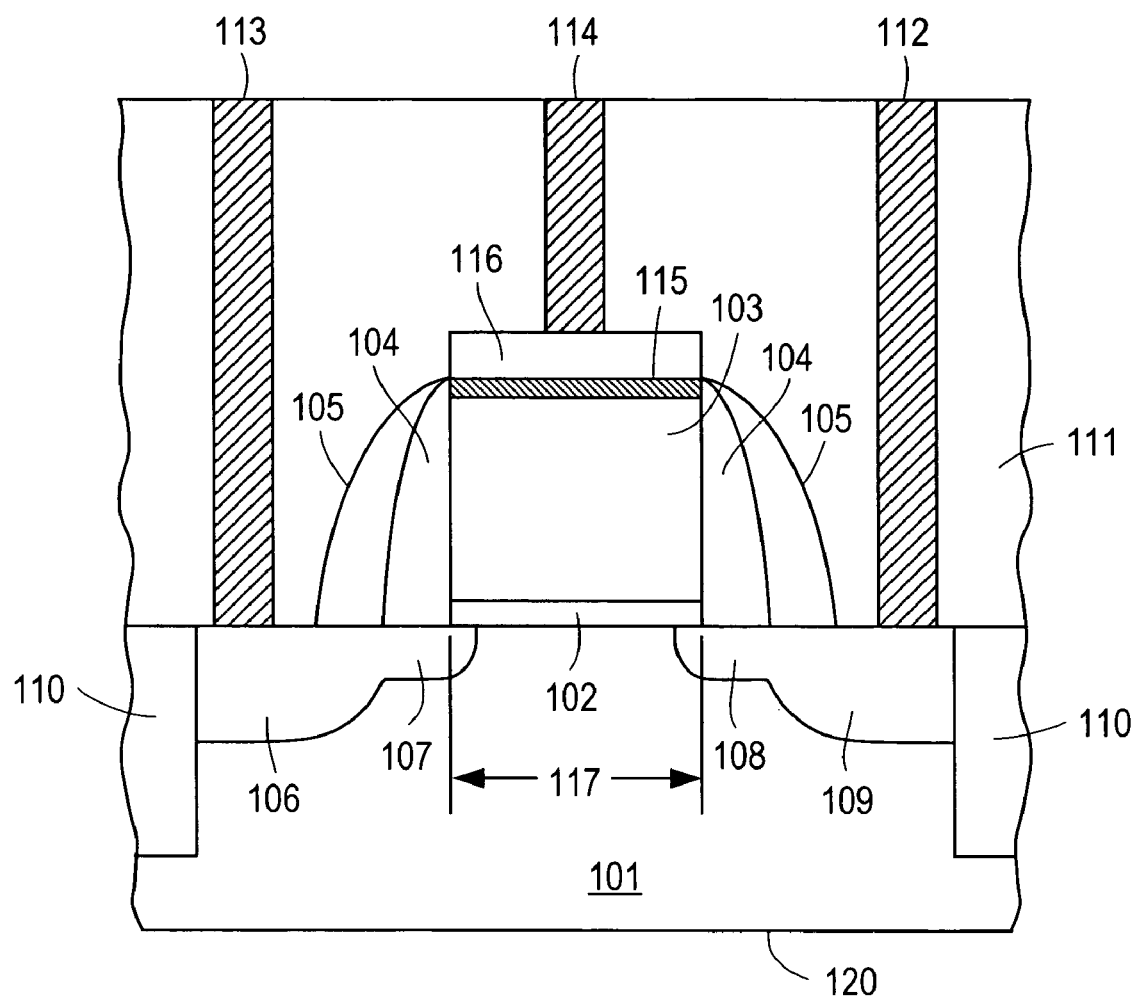
FIG. 1 shows a cross-sectional view of one embodiment of a wafer having a selectively deposited insulating layer.

FIG. 1 shows a cross-sectional view 100 of one embodiment of a wafer having a selectively deposited insulating layer. As shown in FIG. 1, the wafer includes a transistor 120. As shown in FIG. 1, transistor 120 includes a gate electrode 103 that is formed on a gate dielectric 102 on a substrate 101. The substrate 101 may include any semiconductor material to make any of integrated circuits, passive, and active devices. In one embodiment, substrate 101 includes monocrystalline silicon. In one embodiment, substrate 101 includes a silicon-on-insulator ("SOI"). For alternate embodiments, substrate 101 may compound semiconductors, for example, indium phosphide, gallium arsenide, gallium nitride, silicon germanium, and silicon carbide.

In alternate embodiments, substrate 101 comprises any material, e.g., silicon on-insulator ("SOI"), Gallium Arsenide ("GaAs"), Germanium ("Ge"), SiGe, and the like. In one embodiment, substrate 101 includes one or more metallization layers of integrated circuits having active and passive devices, e.g., transistors, switches, optoelectronic devices, capacitors, resistors, and interconnects. The one or more metallization layers of integrated circuits are separated from adjacent metallization layers by dielectric material, e.g., interlayer dielectric ("ILD"). The adjacent metallization layers may be electrically interconnected by vias. In one embodiment, field isolation regions 110 that isolate transistor 120 from another device on substrate 101 are formed, as shown in FIG. 1.

In one embodiment, gate dielectric 102 includes silicon dioxide ("SiO$_2$"), silicon oxynitride ("SiO$_x$N$_y$"), and silicon nitride ("Si$_3$N$_4$"), or any combination thereof. In another embodiment, gate dielectric 102 include an oxide of a metal that has a dielectric constant k higher than the dielectric constant of SiO$_2$, for example, zirconium oxide ("ZrO$_2$"), hafnium oxide ("HFO$_2$"), and lanthanum oxide ("La$_2$O$_4$"). Gate dielectric 102 may be formed using a technique, which is known to one of ordinary skill in the art of microelectronic device manufacturing, for example, using any spinning-on, chemical vapor deposition ("CVD"), or sputtering technique.

The gate dielectric thickness may be scaled depending on the dielectric constant of the material used. This thickness may be scaled for each technology to keep gate capacitance value as per device design rules. In an embodiment, the thickness of gate dielectric 102 is in the approximate range of 5 Å to 100 Å. In one embodiment, the width 117 of gate dielectric 102 is less than 45 nanometers.

Gate electrode 103 is formed on gate dielectric 102, as shown in FIG. 1. In one embodiment, gate electrode 103 includes a metal, e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. The gate electrode is described in further detail below with respect to FIG. 2.

As shown in FIG. 1, transistor 120 includes source region 106 having a shallow source extension region ("tip") 107 and a drain region 109 having a shallow drain tip 108 that are formed at the opposite sides of gate electrode 103. In an embodiment, the length of the channel zone under gate dielectric 102 between tip 107 and tip 108 is in the approximate range of 9 nanometers ("nm") to 120 nm.

Source region 106 and drain region 109 may be formed using one of techniques known to one of ordinary skill in the art of microelectronic device manufacturing. In one embodiment, dopants are first implanted into substrate 101 at the opposite sides of gate electrode 103 to form tips 107 and 108. Gate electrode 103 serves as a mask to prevent implantation of dopants into the portions of substrate 101 below gate dielectric 102 which defines the channel zone of transistor 120. In one embodiment, to form an n-MOS transistor, the dopants are n-type dopants, for example, As ions or P ions with the concentration in the approximate range of $10^{18}$ cm$^{-3}$ to $10^{21}$ cm$^{-3}$. In another embodiment, to form a p-MOS transistor structure, the dopants are p-type dopants, for example, boron ions having the concentration in the approximate range of $10^{18}$ cm$^{-3}$ to $10^{21}$ cm$^{-3}$.

Spacers 104 are formed on substrate 101 adjacent to sidewalls of gate electrode 103 and gate dielectric 102, as shown in FIG. 1. Spacers 104 cover sidewalls of gate electrode 103 and top portions of substrate 101 at opposite sides of gate electrode 103. Spacers 104 may be made of an oxide material, a nitride material, or any combination thereof. In one embodiment, spacers 104 include silicon nitride. Formation of spacers 104 is known to one of ordinary skill in the art of microelectronic device manufacturing. In one embodiment, spacers 104 are used to protect the gate electrode 103 from being shorted to the source and/or drain metal contacts during manufacturing. In one embodiment, spacers 104 and gate electrode 103 serve as a mask, which prevents implantation of the dopants into the regions of the substrate 101 below spacers 104 and below gate electrode 103. In one embodiment, deep source and drain regions 106 and 109 are formed by implantation of dopant ions in the substrate 100 to a depth deeper than the tips 107 and 108. In one embodiment, to form an n-MOS transistor, the dopants are n-type dopants, for example, As ions or P ions having the concentration in the approximate range of $10^{18}$ cm$^{-3}$ to $10^{21}$ cm$^{-3}$. In another embodiment, to form a p-MOS transistor, the dopants are p-type dopants, for example, boron ions having the concentration in the approximate range of $10^{18}$ cm$^{-3}$ to $10^{21}$ cm$^{-3}$.

Etch stop layers 105 are formed on substrate 101 adjacent to spacers 104 at opposite sides of gate electrode 103. Etch stop layers 105 are used to protect portions of transistor 120 when openings for self-aligned contacts are etched, as described in further detail below. In one embodiment, etch stop layer 105 include a nitride etch stop layer ("NESL"), e.g., silicon nitride. In one embodiment, NESL may serve as etch stop ("ES") layer during trench contact ("TCN") etch. Because the source/drain regions of p-MOS transistor may be raised due to epi layer, n-MOS transistor areas may need to be etched more than p-MOS transistor areas. In this case, the NESL layer can stop the etch on p-MOS transistor areas while it etches more on n-MOS transistor areas. As shown in FIG. 1, an insulating layer 111 is formed over substrate 101. In one embodiment, insulating layer 111 is a spin-on interlayer dielectric ("ILD"), e.g., silicon dioxide. In another embodiment, insulating layer 111 may include polyimide, epoxy, photodefinable materials, such as benzocyclobutene ("BCB"), and WPR-series materials, or glass. In one embodiment, insulating layer 111 is a low permittivity ("low-k") ILD layer. Typically, "low-k" is referred to the dielectrics having permittivity ("k") lower than the permittivity of silicon dioxide. Insulating layer 111 may be deposited to fill the gap between two adjacent transistors. In one embodiment, insulating layer 111 is deposited to the thickness greater than the height of the gate electrode to cover the gap between the gate electrodes of adjacent transistors. In one embodiment, insulating layer 111 is deposited to the thickness greater than the height of the gate electrode by at least 5 nm. In one embodiment, insulating layer 111 is deposited to the thickness in the approximate range of 50 nm to 500 nm. In one embodiment, insulating layer 111 is deposited onto transistor 120 and exposed top portions of substrate 101 using any blanket deposition techniques known to one of ordinary skill in the art of microelectronic device manufacturing, e.g., using spinning-on, plasma CVD, diffusion furnace CVD, ALD, high-density plasma ("HDP") CVD, or sputtering technique.

As shown in FIG. 1, a self-assembled monolayer ("SAM") 115 is selectively deposited on gate electrode 103. An insulating layer 116 is selectively deposited on SAM 115. Selective deposition of insulating layer 116 and self-assembled monolayer 115 over gate electrode 103 is described in further detail below.

As shown in FIG. 1, self-aligned contacts 113 and 112 are formed through insulating layer 111 to connect to source 106 and drain 109 respectively, as described in further detail below. As shown in FIG. 1, self-aligned contact ("SAC") 114 is formed over gate electrode 103. Self-aligned contact 114 may be formed, for example, due to misalignment. As shown in FIG. 1, gate electrode 103 is insulated from misaligned self-aligned contact 114 by insulating layer 116. In one embodiment, SAC insulating layer 116 protects source 106 and drain 109, SAC 113 and SAC 112 from shorting to gate electrode 103 against misregistration. That is, selectively deposited insulating layer 116 protects gate electrode 103 from a contact-to-gate shorting.

Figure 2:
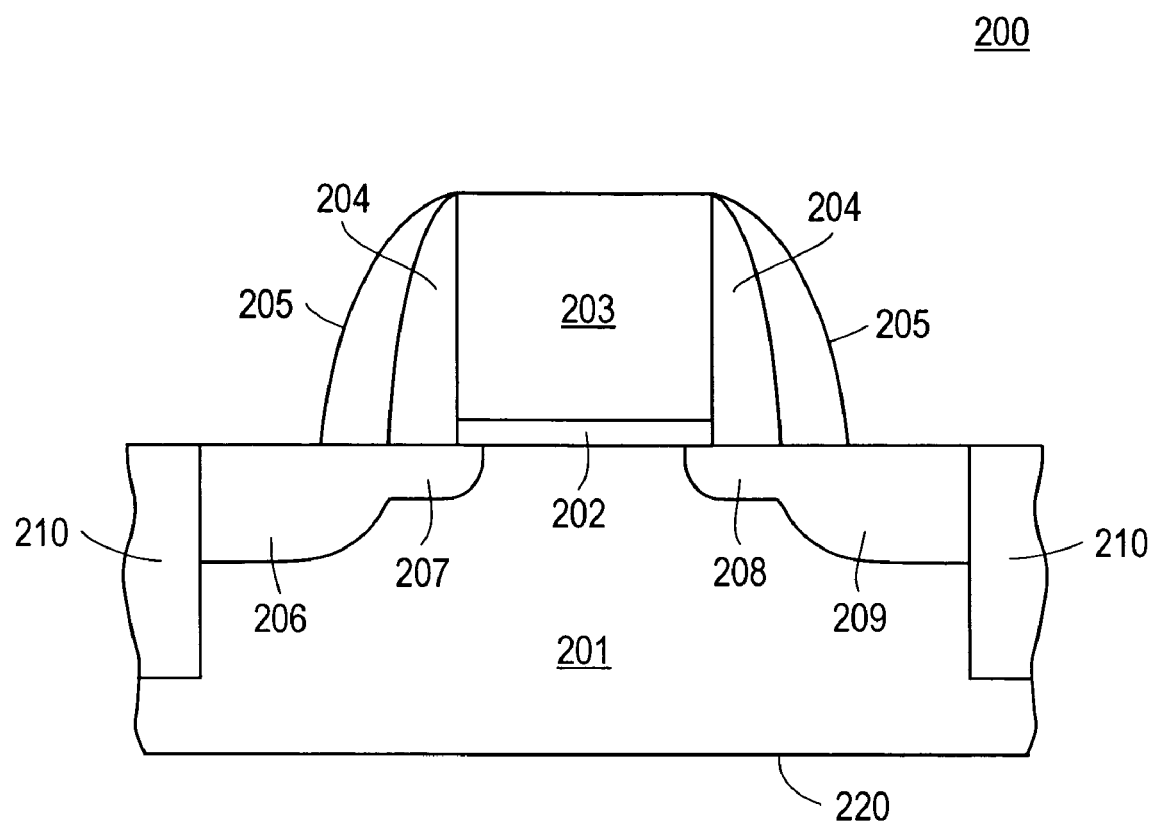
FIG. 2 shows a cross-sectional view of one embodiment of a wafer to form self-aligned contacts.

FIG. 2 shows a cross-sectional view 200 of one embodiment of a wafer to form self-aligned contacts. As shown in FIG. 2, the wafer includes a transistor 220. As shown in FIG. 2, transistor includes a gate electrode 203 formed on a gate dielectric 202 that is deposited on a substrate 201. In one embodiment, gate electrode 203 includes a metal, e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. In one embodiment, gate electrode 203 includes a metal alloy or a compound (e.g., a metal nitride) that has copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof. In one embodiment, gate electrode 203 includes a noble metal, e.g. gold, silver, tantalum, platinum, rhodium, or any combination thereof. In one embodiment, gate electrode 203 is a composite gate electrode that has a metal top layer (not shown). In one embodiment, gate electrode 203 includes an aluminum top layer on titanium nitride that is deposited on another conductive material. In one embodiment, the top layer of gate electrode 203 is a noble metal layer. In another embodiment, gate electrode 203 is a composite gate electrode that includes a metal, a polysilicon, polysilicon germanium, nitride, oxide, or any combination thereof. In one embodiment, the thickness of gate electrode 203 is in the approximate range of 5 nanometers ("nm") and 300 nm. Gate electrode 203 may be formed using one of the deposition and patterning techniques, which are known to one of ordinary skill in the art of microelectronic device manufacturing.

Source region 206 having tip 207 and a drain region 209 having tip 208 are formed at the opposite sides of gate electrode 203. Spacers 204 are formed on substrate 201 adjacent to sidewalls of gate electrode 203 and gate dielectric 202, as shown in FIG. 2. Spacers 204 cover sidewalls of gate electrode 203 and top portions of substrate 201 at opposite sides of gate electrode 203. Etch stop layers 205 are formed on substrate 201 adjacent to spacers 204 at opposite sides of gate electrode 203. In one embodiment, field isolation regions 210 that isolate transistor 220 from another device on substrate 201 are formed, as shown in FIG. 2. Transistor 220 is described in detail above with respect to FIG. 1.

Figure 3:
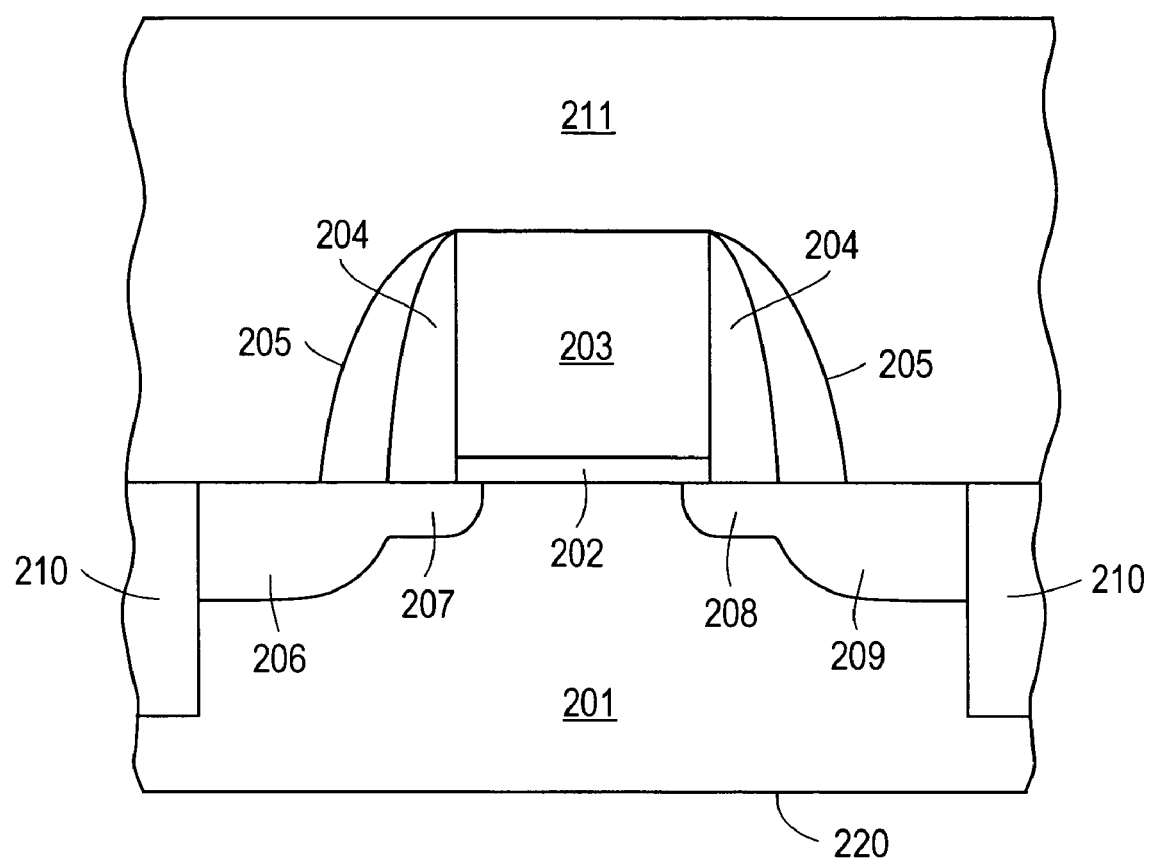
FIG. 3 is a view similar to FIG. 2, after a first insulating layer is deposited over a transistor on a substrate according to one embodiment of the invention.

FIG. 3 is a view similar to FIG. 2, after a first insulating layer 211 is deposited over transistor 220 on substrate 201 according to one embodiment of the invention. As shown in FIG. 3, insulating layer 211 covers exposed top portions of substrate 201. In one embodiment, insulating layer 211 is a spin-on interlayer dielectric (ILD), e.g., silicon dioxide. In another embodiment, insulating layer 211 may include polyimide, epoxy, photodefinable materials, such as benzocyclobutene ("BCB"), and WPR-series materials, or glass. In one embodiment, insulating layer 211 is a low permittivity ("low-k") ILD layer. Typically, "low-k" is referred to the dielectrics having permittivity ("k") lower than the permittivity of silicon dioxide. In one embodiment, insulating layer 211 may be deposited onto transistor 220 and exposed top portions of substrate 201 using any blanket deposition techniques known to one of ordinary skill in the art of microelectronic device manufacturing, by spinning-on, plasma CVD, diffusion furnace CVD, atomic layer deposition ("ALD"), high-density plasma ("HDP") CVD. In one embodiment, insulating layer 211 is deposited to the thickness greater than the height of the gate electrode by at least 5 nm. In one embodiment, insulating layer 211 is deposited to the thickness in the approximate range of 50 nm to 500 nm.

Figure 4:
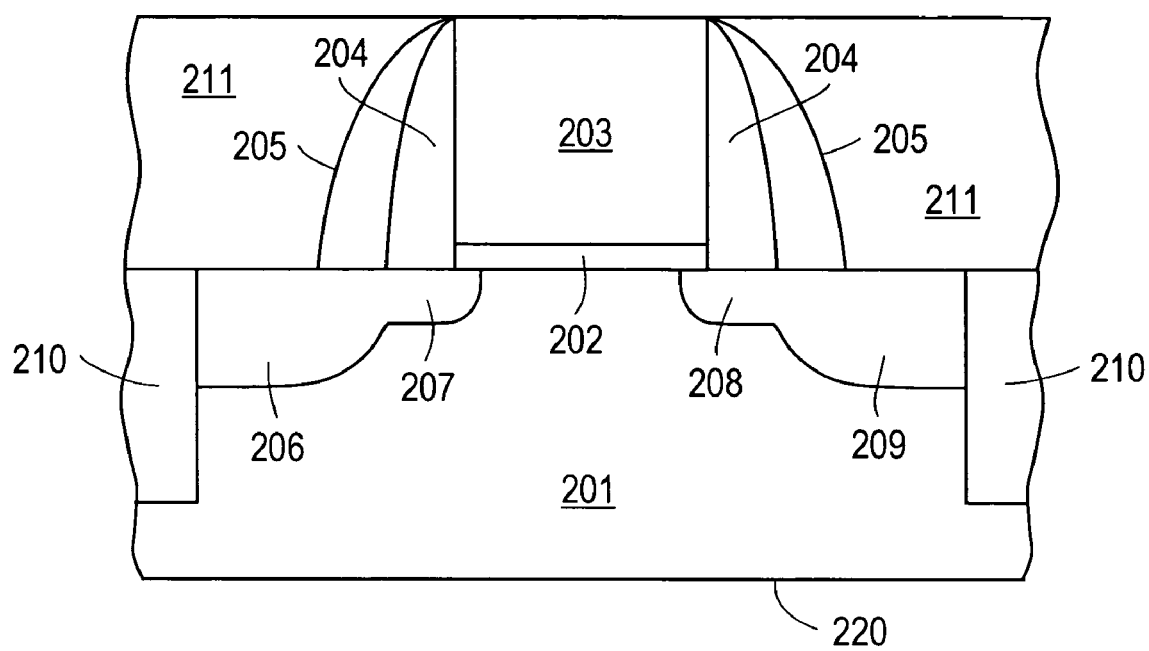
FIG. 4 is a view similar to FIG. 3, after removing portions of the first insulating layer to expose a gate electrode according to one embodiment of the invention.

FIG. 4 is a view similar to FIG. 3, after removing portions of insulating layer 211 to expose a top surface of gate electrode 203 according to one embodiment of the invention. In one embodiment, portions of insulating layer 211 are removed using chemical-mechanical polishing ("CMP"). In another embodiment, portions of insulating layer 211 are removed using an etching technique, for example, using wet etching, dry etching, or both. CMP and etching techniques are known to one of ordinary skill in the art of microelectronic device manufacturing.

Figure 5:
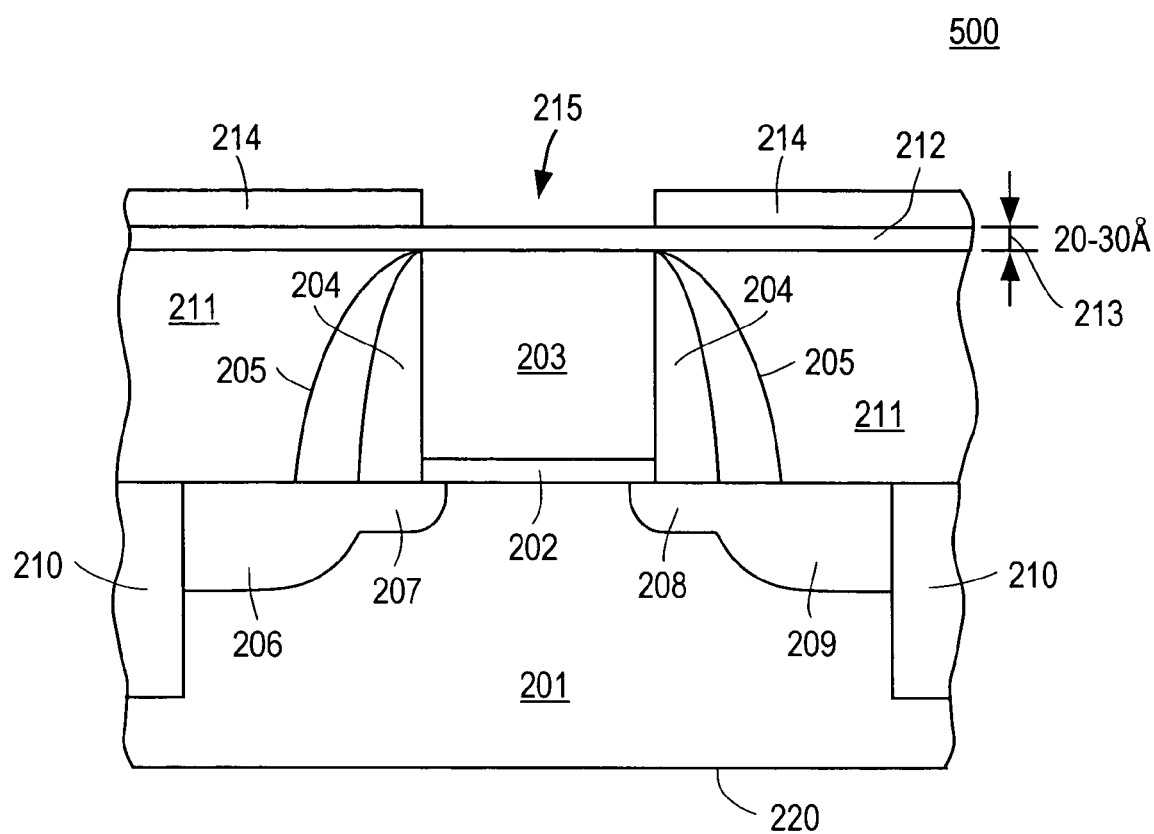
FIG. 5 is a view similar to FIG. 4, after a first self-assembled monolayer is deposited on the wafer according to one embodiment of the invention.

FIG. 5 is a view similar to FIG. 4, after a first self-assembled monolayer is deposited on the wafer according to one embodiment of the invention. As shown in FIG. 4, SAM 212 is adsorbed on the top surface of gate electrode 203 and on the top surface of insulating layer 211. In one embodiment, SAM 212 includes a hydrophobic layer that does not interact with water and precursors used later on in the process. In one embodiment, SAM 212 is alkanethiolate-based having $CH_3$-terminated molecules that are hydrophobic. In one embodiment, SAM 212 is alkanethiolate $\{X(CH2)_nS^-\}$, where n is between 5-20, and head group X is methyl ("$CH_3$")-terminated. The $CH_3$-terminated head group is hydrophobic. In one embodiment, SAM 212 has methyl ("$CH_3$")-terminated head group that is hydrophobic and does not have a functional group to interact with water and precursors used later on in the process. In another embodiment, SAM 212 is alkanethiolate $\{X(CH2)_nS^-\}$, where head group X is Si—$(CH_3)_3$ that is hydrophobic. In yet another embodiment, SAM 212 is a hydrophobic layer that has fluorine "$CF_3$"-terminated molecules that do not react with water and precursors used later on in the process. In one embodiment, SAM 212 is deposited on the wafer using a spinning-on technique. In another embodiment, SAM 212 is deposited on the wafer using sputtering. In yet another embodiment, SAM 212 is deposited on the wafer using a CVD technique or low pressure vapor phase deposition. In one embodiment, SAM 212 is deposited on the wafer to the thickness 213 in the approximate range of 10 Å-40 Å. In one embodiment, alkanethiolate-based SAM 212 that has $CH_3$-terminated molecules is deposited on silicon dioxide insulating layer 211 and on the top surface of gate electrode 203 that includes aluminum. In another embodiment, alkanethiolate-based SAM 212 that has $CH_3$-terminated molecules is deposited on silicon dioxide insulating layer 211 and on the top surface of gate electrode 203 that includes a noble metal.

Next, a photoresist 214 is deposited on SAM 212, as shown in FIG. 5. For example, photoresist 214 can be deposited using a spinning-on technique. As shown in FIG. 5, photoresist 214 is patterned and etched to expose a portion 215 of SAM 212 above gate electrode 203. Depositing, patterning and etching of the photoresist are known to one of ordinary skill in the art of microelectronic device manufacturing.

Figure 5A:
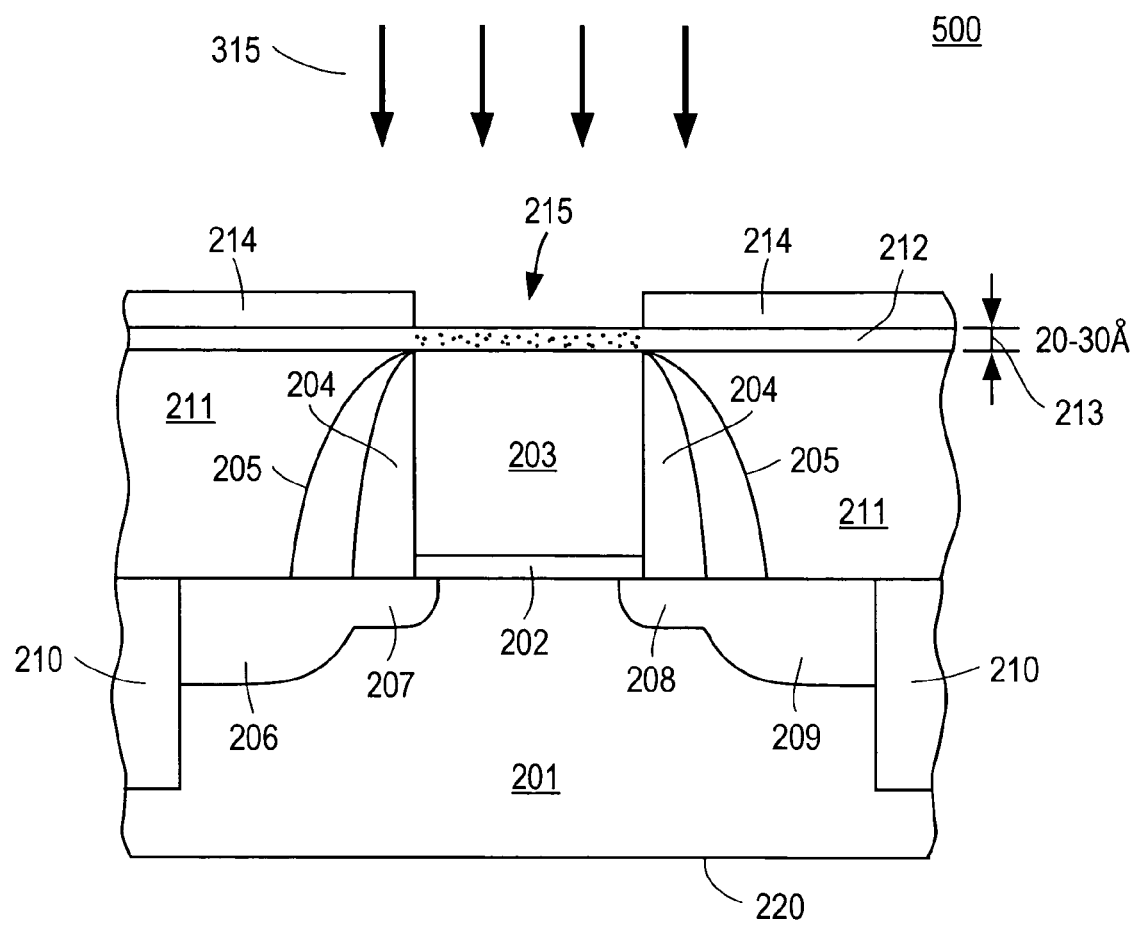
FIG. 5A is a view similar to FIG. 5 that illustrates exposing of a portion of the self-assembled monolayer to UV light.
Figure 6:
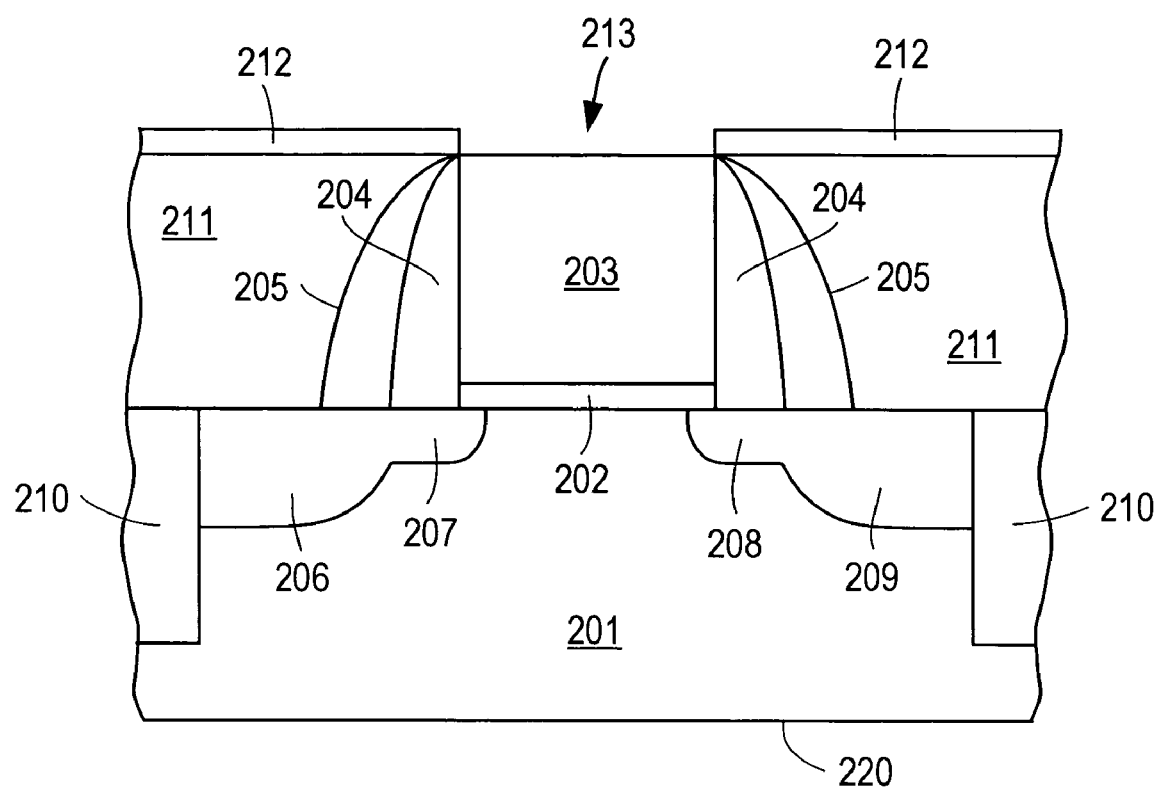
FIG. 6 is a view similar to FIG. 5, after a portion of the first self-assembled monolayer is removed to expose a gate electrode according to one embodiment of the invention.

Next, portion 215 is exposed to UV light, as shown in FIG. 5A. In one embodiment, the portion of SAM 212 on the top of gate electrode 203 is exposed to UV light for approximately 15 min to 1.5 hours. As shown in FIG. 5A, portion 215 of SAM 212 exposed to the UV light is transformed to sulfate. In one embodiment, portion 215 of SAM 212 on gate electrode 203 is exposed to ultra-violet ("UV") light using, for example, a UV flash light in the presence of ambient or an oxygen-rich environment. Using of the UV flash light is known to one of ordinary skill in the art of microelectronic device manufacturing. In another embodiment, photoresist 214 is not used, and portion 215 of SAM 212 is directly exposed to UV light through a litho mask (not shown). In such a case, only the areas of the mask that allow UV light through would generate SAM-sulfate conversion in corresponding portions of SAM 212. FIG. 6 is a view similar to FIG. 5, after portion of the first SAM 212 is removed to expose a top surface 213 of gate electrode 203 according to one embodiment of the invention. Further, the transformed to the sulfate portion of SAM 212 is removed from the top surface of gate electrode 203 using water. In another embodiment, the exposed portion of SAM 212 is removed using etching.

Figure 7:
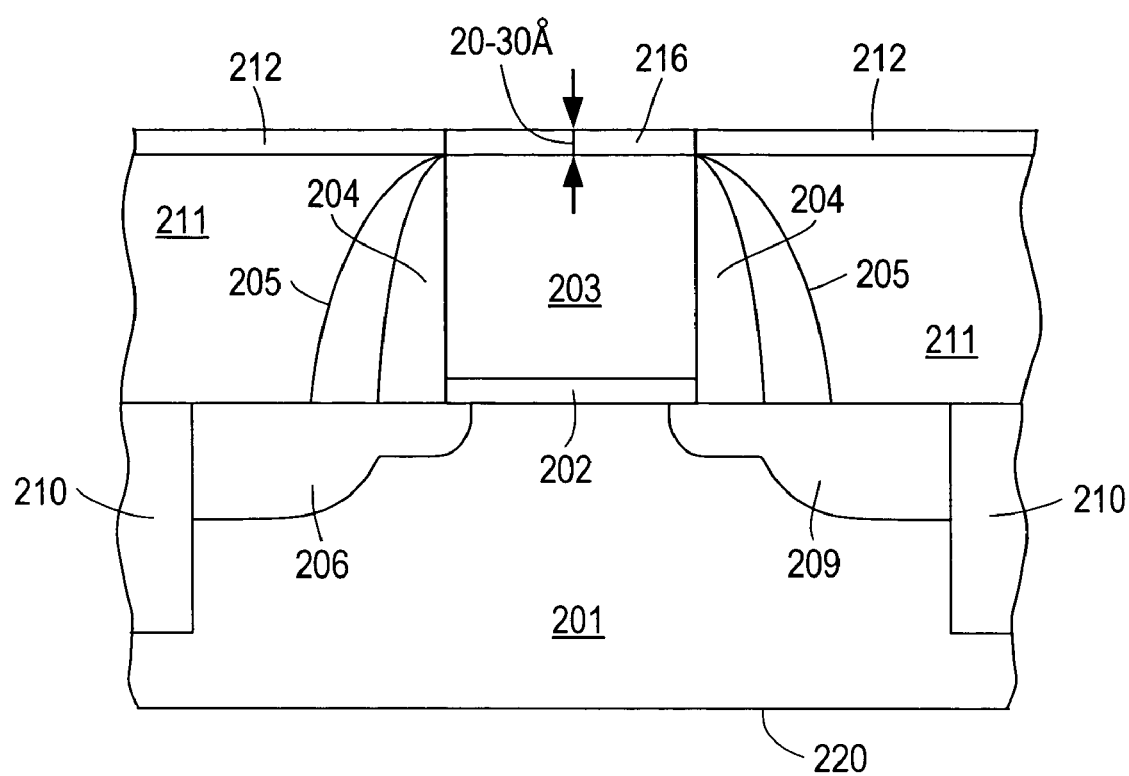
FIG. 7 is a view similar to FIG. 6, after a second self-assembled monolayer is selectively deposited on the gate electrode according to one embodiment of the invention.

FIG. 7 is a view similar to FIG. 6, after a second self-assembled monolayer SAM 216 is selectively deposited on the gate electrode 203 according to one embodiment of the invention. As shown in FIG. 4, SAM 216 is adsorbed only on the top surface of gate electrode 203 and is not adsorbed on SAM 212. In one embodiment, SAM 216 includes a hydrophilic layer that reacts with water and various precursors used later on in the process. As shown in FIG. 216 hydrophilic SAM 216 is not adsorbed on hydrophobic SAM 212. In one embodiment, SAM 216 has hydroxyl ("OH")-terminated molecules that are hydrophilic and interact with various precursors used later on in the process. In one embodiment, SAM 216 is alkanethiolate-based having OH-terminated molecules that are hydrophilic. In one embodiment, SAM 216 is alkanethiolate $\{X(CH2)_nS^-\}$, where n is between 5-20, and head group X is OH-terminated. The OH-terminated head group is hydrophilic. In another embodiment, SAM 216 is alkanethiolate $\{X(CH2)_nS^-\}$, where head group X is Si—COOH that is hydrophilic. In one embodiment, SAM 216 is deposited on gate electrode 203 using a spinning-on technique. In another embodiment, SAM 216 is deposited on the top surface of gate electrode 203 using sputtering or low pressure vapor phase deposition. In yet another embodiment, SAM 216 is deposited on the top surface of gate electrode 203 using a CVD technique. In one embodiment, SAM 216 is deposited on top surface of gate electrode 203 to the thickness 213 in the approximate range of 10 Å-40 Å. In one embodiment, alkanethiolate-based SAM 216 that has OH-terminated molecules is deposited on the top surface of gate electrode 203 that includes aluminum. In another embodiment, alkanethiolate-based SAM 216 that has OH-terminated molecules is deposited on the top surface of gate electrode 203 that includes a noble metal.

Figure 8:
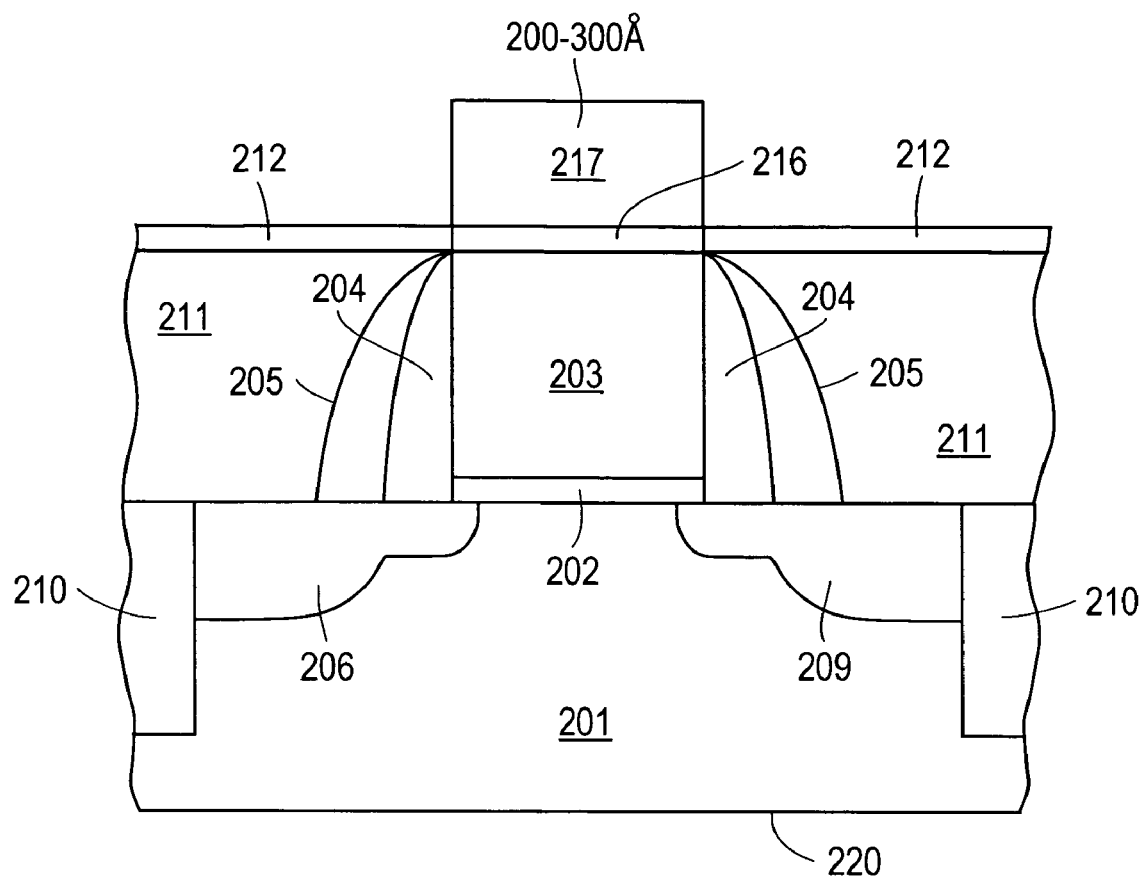
FIG. 8 is a view similar to FIG. 7, after a second insulating layer is deposited on the second SAM according to one embodiment of the invention.

FIG. 8 is a view similar to FIG. 7, after a second insulating layer is deposited according to one embodiment of the invention. As shown in FIG. 8, second insulating layer 217 is deposited on SAM 216. In one embodiment, insulating layer 217 is selectively deposited only on hydrophilic SAM 216. In one embodiment, insulating layer 217 includes a metal oxide, e.g., titanium oxide $TiO_x$, where x is 1-2; $TiN_xO_{1-x}$; or tantalum oxide $TaO_x$, where x is 1, 2. In one embodiment, insulating layer 217 that includes $TiO_x$, $TiN_xO_{1-x}$; or $TaO_x$ is selectively deposited only on alkanethiolate-based SAM 216 that has OH-terminated molecules. As shown in FIG. 8, insulating layer 217 is not grown on hydrophobic SAM 212. SAM 216 acts as an adhesion layer to deposit insulating layer 217 on metal gate electrode 203. In one embodiment, insulating layer 217 includes a high-k dielectric, e.g., zirconium oxide ("$ZrO_2$"), hafnium oxide ("$HFO_2$"), and lanthanum oxide ("$La_2O_4$"). In one embodiment, insulating layer 217 is deposited on SAM 216 to the thickness in the approximate range of 100 Å to 300 Å. In one embodiment, insulating layer 217 is selectively deposited on SAM 216 at a temperature that is less than a degradation temperature of self-assembled monolayer, for example, less than 150° C. In one embodiment, insulating layer 217 is selectively deposited on SAM 216 using an atomic layer deposition ("ALD") technique. In one embodiment, wafer 700 as depicted in FIG. 7 is placed in an ALD chamber (not shown). In one embodiment, insulating layer 217 is selectively deposited onto SAM 216 at a temperature about 100° C. using a precursor containing a metal, e.g. titanium, or tantalum, and water. The precursor used in the ALD chamber reacts only with SAM 216, and does not react with SAM 212. For example, due to a chemical reaction between titanium and water in ALD chamber, titanium oxide film is grown, e.g., chemically bonded, only on the hydrophilic SAM 216 and is not grown on the hydrophobic SAM 212. In one embodiment, the wafer having SAM 216 is being exposed to a metal-precursor and water in cycles. In one embodiment, to selectively deposit $TiO_2$ insulating layer 217, the wafer with alkanethiolate-based SAM 216 having OH-terminated molecules is being exposed to $[Ti(OPr^i)_4]$-precursor and water in cycles at 100° C. During each cycle the wafer is exposed to $[Ti(OPr^i)_4]$-precursor for approximately 1-15 seconds, and to water for approximately 1-15 seconds. In one embodiment, insulating layer 217 is a high-k dielectric that is stable at high temperatures up to about 800° C. As such, the properties of insulating layer 217 do not change during other annealing operations that may occur later on in the process. In one embodiment, the pressure in the ALD chamber to deposit insulating layer 217 is less than 1 Torr. In one embodiment, insulating layer 217 is deposited on SAM 216 to the thickness in the approximate range of 100 Å-500 Å.

Figure 9:
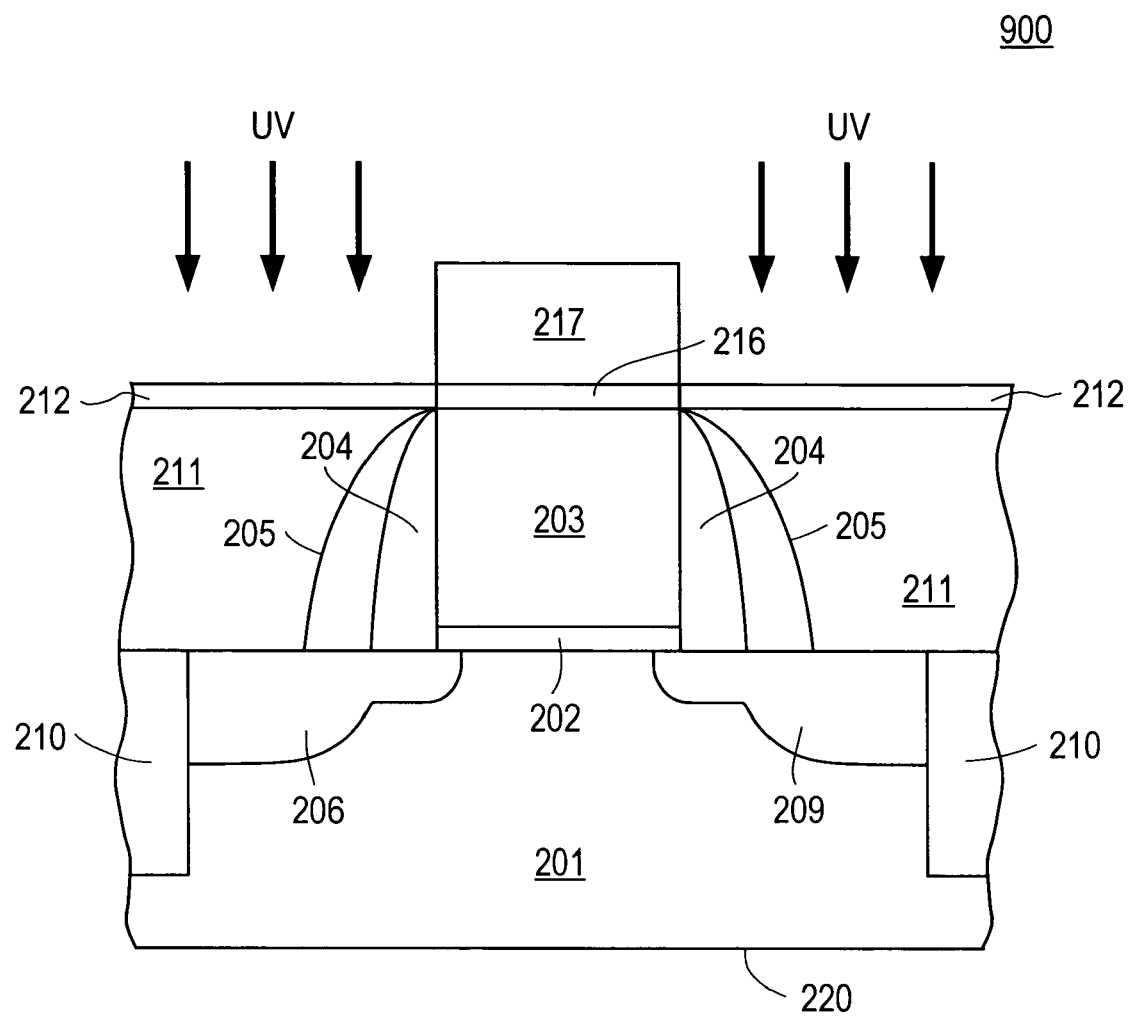
FIG. 9 is a view similar to FIG. 8, illustrating illuminating of the first SAM using a UV light.

Next, a second SAM 212 is illuminated using a UV light, as shown in FIG. 9. In one embodiment, the portions of SAM 212 on insulating layer 211 are exposed to UV light for approximately 15 minutes to 1.5 hours, using for example, a UV flash light. Using of the UV flash light is known to one of ordinary skill in the art of microelectronic device manufacturing.

Figure 10:
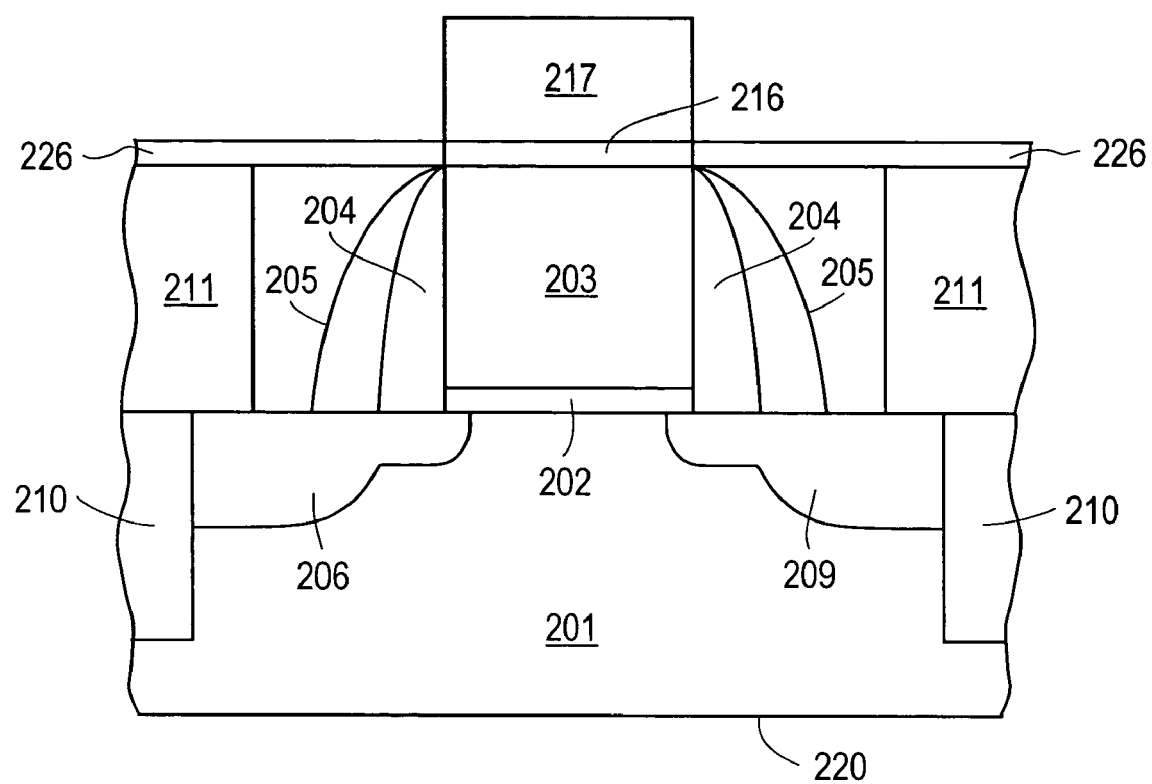
FIG. 10 is a view similar to FIG. 9, after the first SAM is transformed to a sulfate layer according to one embodiment of the invention.

FIG. 10 is a view similar to FIG. 9, after SAM 212 is transformed to sulfate layer 226 according to one embodiment of the invention. Next, sulfate layer 226 is removed from the top surface of insulating layer 211.

Figure 11:
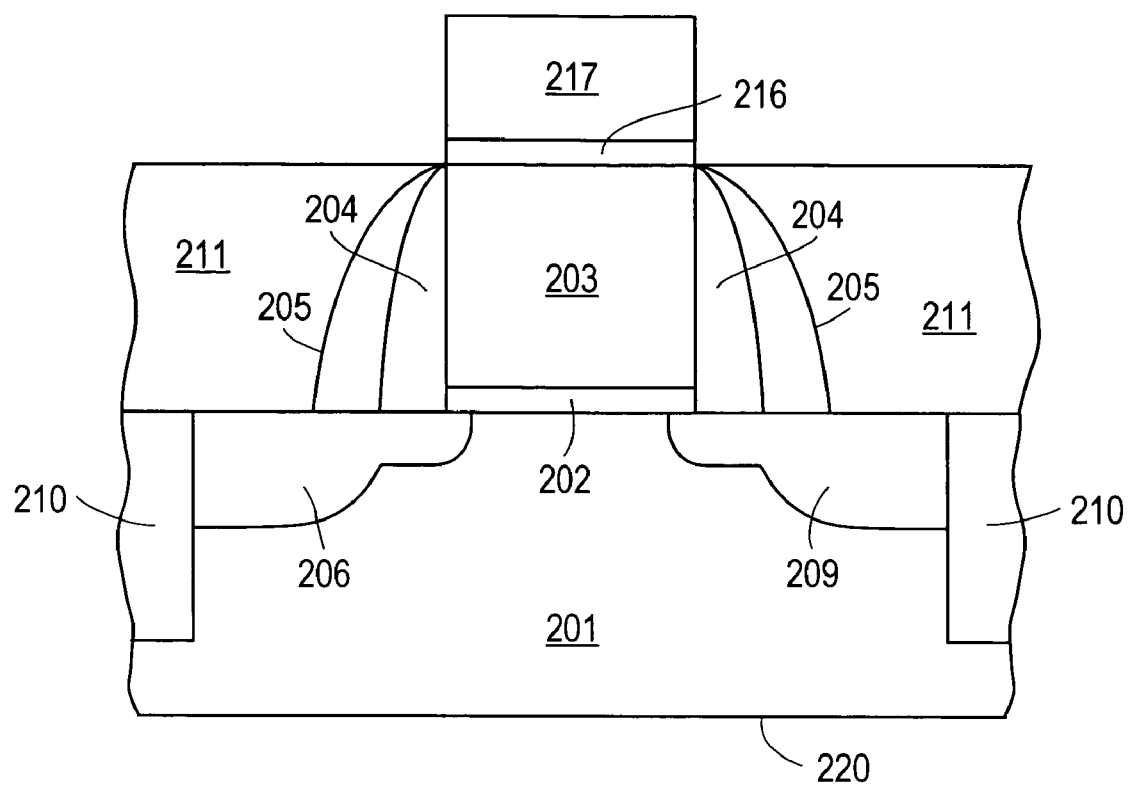
FIG. 11 is a view similar to FIG. 10, after the sulfate layer is removed according to one embodiment of the invention.

FIG. 11 is a view similar to FIG. 10, after sulfate layer 226 is removed according to one embodiment of the invention. In one embodiment, sulfate layer 226 is removed from the top surface of insulating layer 211 by cleaning the wafer using water. As shown in FIG. 11, selectively deposited insulating layer 217 protects gate electrode 203 from being shorted to a self-aligned contact formed later on in the process.

Figure 12:
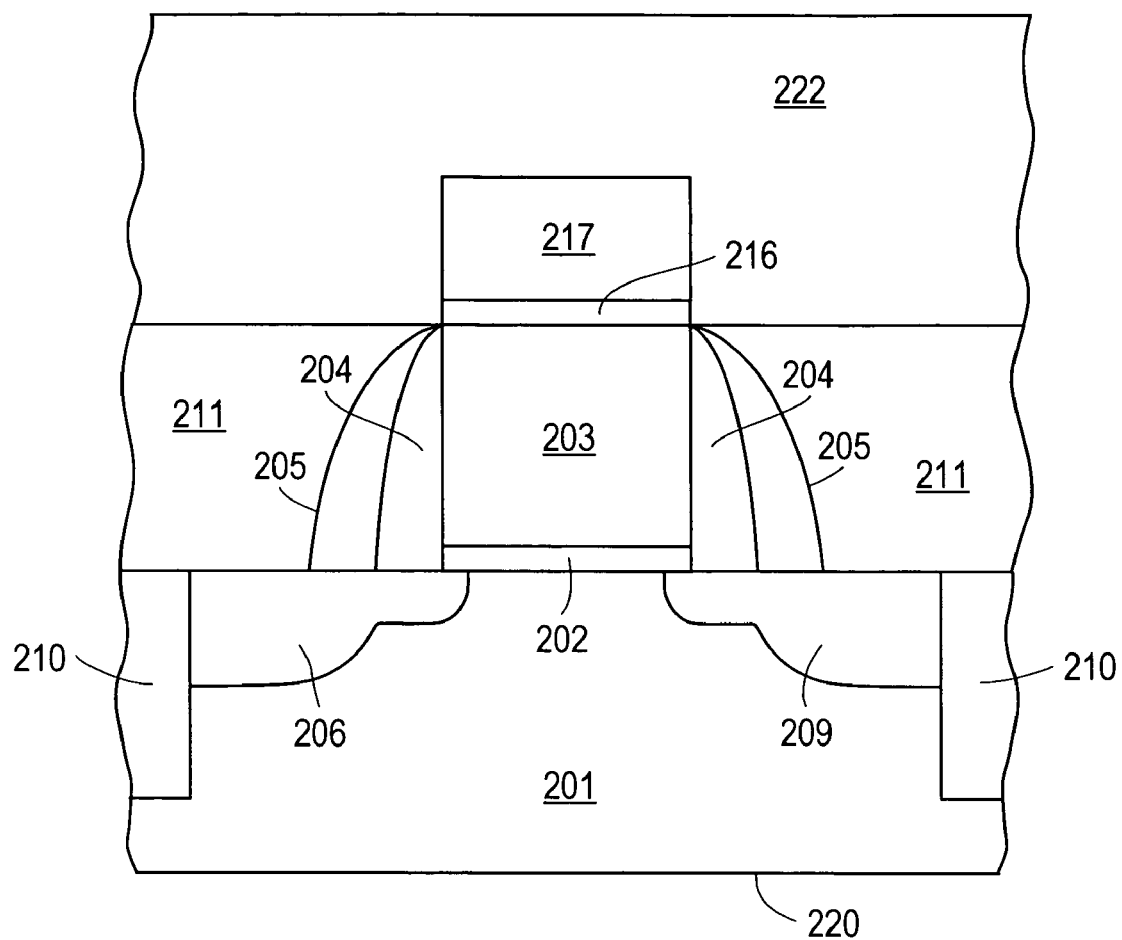
FIG. 12 is a view similar to FIG. 11, after depositing of a third insulating layer according to one embodiment of the invention.

FIG. 12 is a view similar to FIG. 11, after depositing of a third insulating layer according to one embodiment of the invention. As shown in FIG. 12, third insulating layer 222 is deposited on insulating layer 217 and insulating layer 211. In one embodiment, insulating layer 222 is a spin-on interlayer dielectric ("ILD"), e.g., silicon dioxide. In another embodiment, insulating layer 222 may include polyimide, epoxy, photodefinable materials, such as benzocyclobutene ("BCB"), and WPR-series materials, or glass. In one embodiment, insulating layer 222 is a low permittivity ("low-k") ILD layer. In one embodiment, insulating layer 222 may be deposited onto insulating layer 211 and insulating layer 217 using any blanket deposition techniques known to one of ordinary skill in the art of microelectronic device manufacturing, by spinning-on, plasma CVD, diffusion furnace CVD, atomic layer deposition ("ALD"), high-density plasma ("HDP") CVD. In one embodiment, insulating layer 222 is deposited to the thickness in the approximate range of 15 nm to 500 nm.

Figure 13:
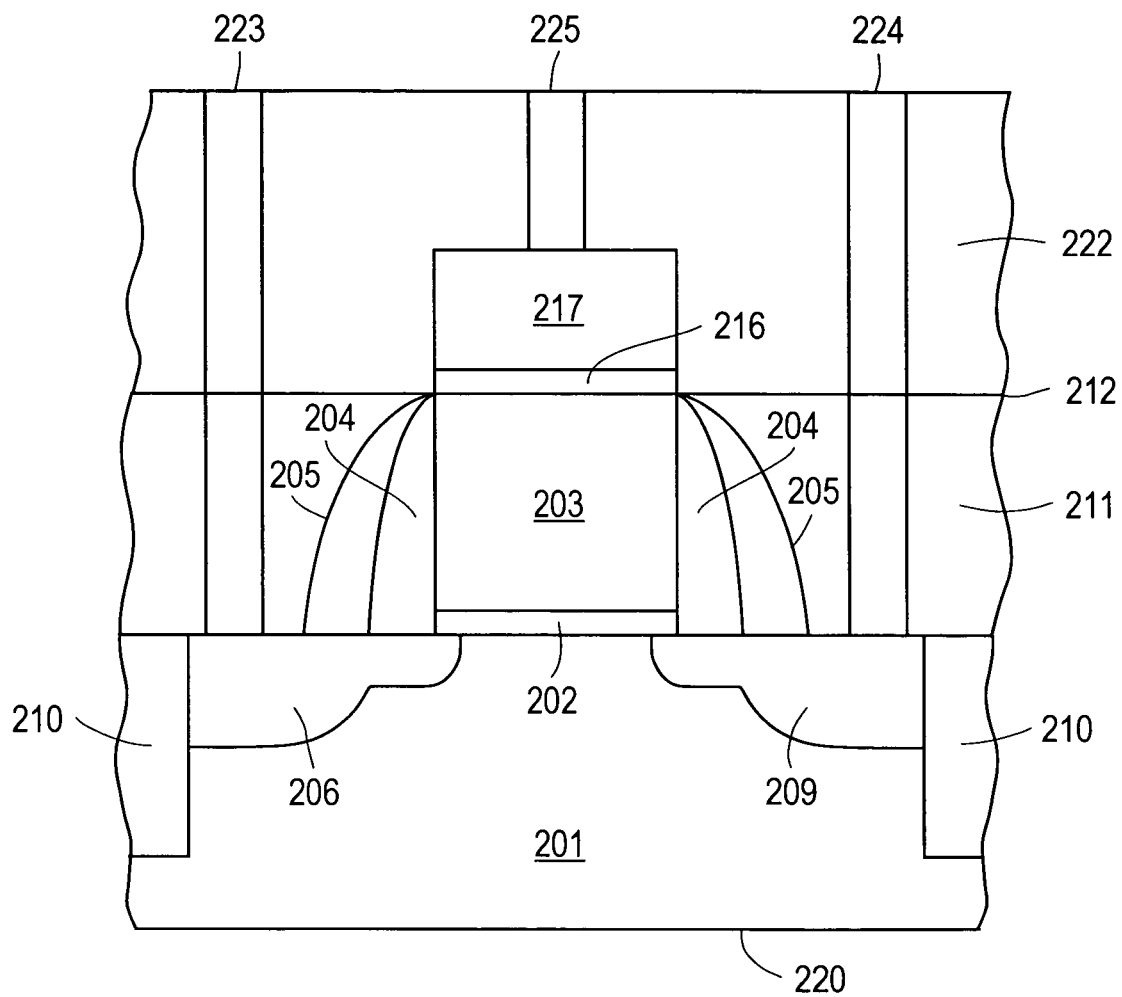
FIG. 13 is a view similar to FIG. 12, after openings are formed in the third insulating layer to form self-aligned contacts according to one embodiment of the invention.

FIG. 13 is a view similar to FIG. 12, after openings ("vias") 223, 224, and 225 are formed through insulating layer 222 to form self-aligned contacts according to one embodiment of the invention. In one embodiment, insulating layer 222 is patterned and etched to form self-aligned contacts. Techniques to pattern and etch insulating layer are known to one of ordinary skill in the art of microelectronic device manufacturing. In one embodiment, the diameter of each of openings 223, 224, and 225 is in the approximate range of 0.2 um to 30 um. In another embodiment, the diameter of each of openings 223, 224, and 225 is determined by the aspect ratios of the vias, which may be in the approximate range of 1:10 to 1:100. In one embodiment, openings 223, 224*m* and 225 have a tapered shape. The top of the openings 223, 224, and 225 may be wider than the bottom. In one embodiment, the width of the openings 223, 224, and 225 at the top is approximately the width of the gap between gate electrodes of adjacent transistors (not shown). In one embodiment, openings 223 and 224 are formed by etching through insulating layers 222, and 211 to expose the top surface of the substrate 201 that includes source 206 and drain 209 regions. As shown in FIG. 13, etch stops 205 are used to protect portions of transistor 220 when openings 223 and 224 for self-aligned contacts are etched. In one embodiment, etch stops 205 include a nitride etch stop layer ("NESL"), e.g., silicon nitride SiN, and SiCN. In one embodiment, NESL may serve as etch stop ("ES") layer during trench contact ("TCN") etch. Because the source/drain regions of p-MOS transistor may be raised due to epi layer, n-MOS transistor areas may need to be etched more than p-MOS transistor areas. In one embodiment, the NESL layer can stop the TCN etch on p-MOS transistor areas while it etches more on n-MOS transistor areas. In one embodiment, etch stops 205 have higher etch selectivity to that of SAD insulating layer 217 to prevent portions of insulating layer 217 from being etched away during TCN etch. As shown in FIG. 13, misaligned opening 225 is formed above gate electrode 203. As shown in FIG. 13 (etching of opening 225 in insulating layer 222 is stopped at insulating layer 217 that acts as an etch stop layer.

Figure 14:
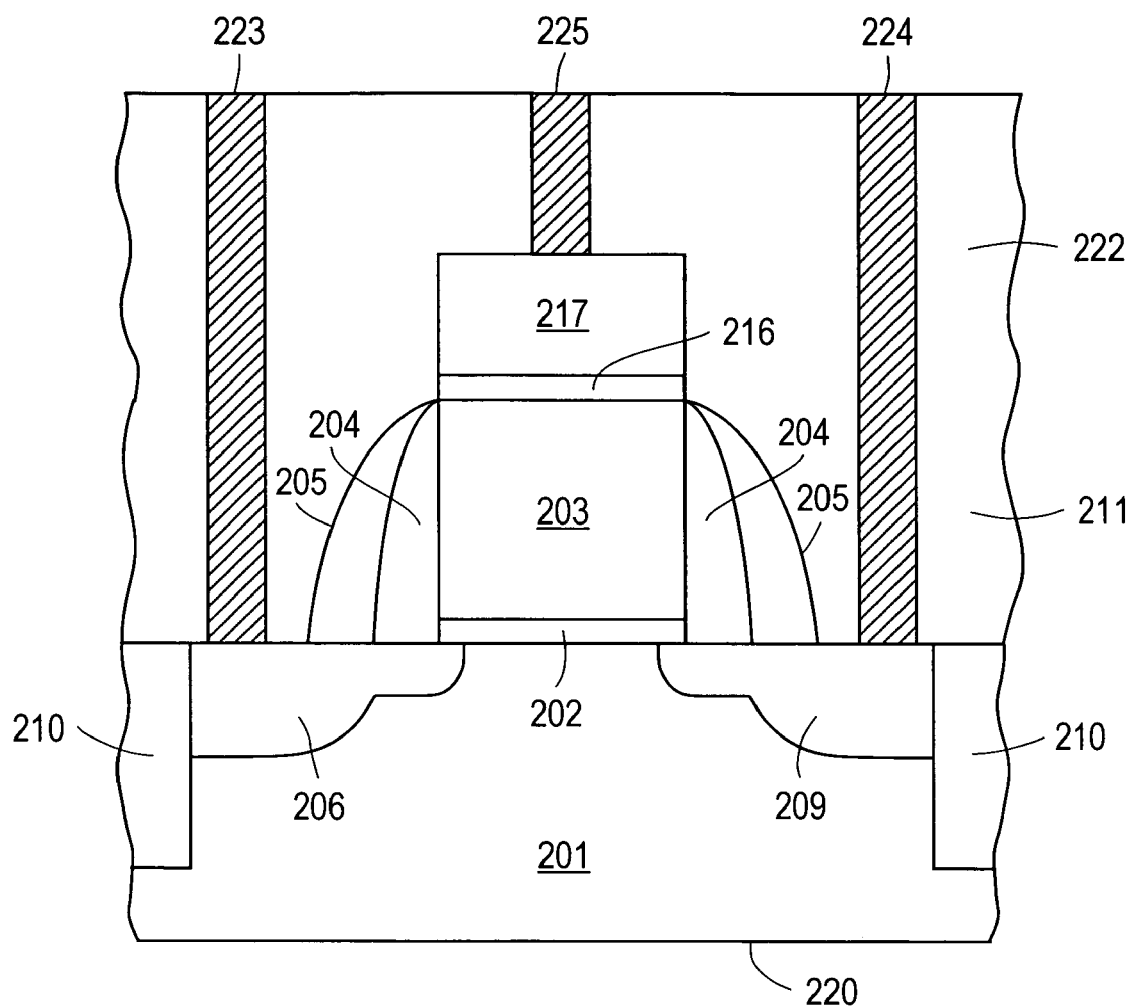
FIG. 14 is a view similar to FIG. 11, after the openings are filled with a conductive material to form self-aligned contacts according to one embodiment of the invention.

FIG. 14 is a view similar to FIG. 13, after openings 223, 224, and 225 are filled with a conductive material to form self-aligned contacts according to one embodiment of the invention. In one embodiment, a conductive seed layer (not shown) is deposited on a conductive barrier layer (not shown) that is deposited onto internal sidewalls of openings 223, 224, and 225 and exposed portions of the top surface of substrate 201 and exposed portion of insulating layer 217. In one embodiment, the conductive barrier layer deposited onto internal sidewalls of openings 223, 224, and 225 includes aluminum, titanium, tantalum, cobalt, tantalum nitride, and the like metals, and the seed layer deposited onto conductive barrier layer includes copper. The conductive barrier layer can act as a diffusion barrier layer to prevent diffusion of conductive material from the seed layer, e.g., copper, into insulating layers 222 and 211, and also may provide adhesion for the seed layer. In another embodiment, the seed layer is deposited directly onto internal sidewalls of openings 223-225. The conductive barrier layer and the seed layer may be deposited using any thin film deposition technique known to one of ordinary skill in the art of microelectronic device manufacturing, e.g., by sputtering, blanket deposition, and the like. In one embodiment, each of the conductive barrier layer and the seed layer has the thickness in the approximate range of 10 to 300 nm. Next, a conductive material is deposited into openings 223-225. In one embodiment, a conductive material, e.g., copper, is deposited into openings 223-225, for example, by electroplating. In one embodiment, the conductive material is deposited into openings 223-225 using a damascene process that is known to one of ordinary skill in the art of microelectronic device manufacturing.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method, comprising:
   depositing a first self-assembled monolayer on a wafer that includes a device having a first electrode;

removing a portion of the first self-assembled monolayer to expose the first electrode;

depositing a second self-assembled monolayer on the first electrode; and depositing an insulating layer on the second self-assembled monolayer, wherein the depositing of the insulating layer includes an atomic layer deposition.

2. A method to form self-aligned contacts, comprising:

depositing a first self-assembled monolayer on a gate electrode and a first insulating layer over a substrate;

removing a portion of the first self-assembled monolayer to expose the gate electrode;

depositing a second self-assembled monolayer on the gate electrode selectively depositing a second insulating layer on the second self-assembled monolayer, forming openings in the first insulating layer; and filling the openings with a conductive material to form self-aligned contacts.

3. The method of claim 2, wherein the selectively depositing of the second insulating layer is performed at a temperature less than 150° C.

4. The method of claim 2, wherein the depositing of the self-assembled monolayer includes spinning on the self-assembled monolayer over the substrate.

5. The method of claim 2, wherein the removing includes exposing the portion of the first self-assembled monolayer over the gate electrode to a UV light.

6. The method of claim 2, wherein the first self-assembled monolayer includes methyl terminated molecules.

7. The method of claim 2, wherein the second self-assembled monolayer includes hydroxyl terminated molecules.

8. A method to form self-aligned contacts, comprising:

depositing a first self-assembled monolayer on a gate electrode and a first insulating layer over a substrate;

removing a portion of the first self-assembled monolayer to expose the gate electrode;

depositing a second self-assembled monolayer on the gate electrode;

selectively depositing a second insulating layer on the second self-assembled monolayer, wherein the selectively depositing of the second insulating layer includes an atomic layer deposition.

* * * * *